(12) United States Patent
Park et al.

(10) Patent No.: US 12,150,245 B2
(45) Date of Patent: Nov. 19, 2024

(54) ELECTRONIC APPARATUS

(71) Applicant: SAMSUNG DISPLAY CO., LTD., Yongin-si (KR)

(72) Inventors: Jinhyuk Park, Yongin-si (KR); Youngmyung Lee, Yongin-si (KR); Jongnam Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 210 days.

(21) Appl. No.: 17/465,489

(22) Filed: Sep. 2, 2021

(65) Prior Publication Data
US 2022/0248527 A1 Aug. 4, 2022

(30) Foreign Application Priority Data

Jan. 29, 2021 (KR) .................. 10-2021-0013473

(51) Int. Cl.
*H05K 1/02* (2006.01)
*G04G 17/04* (2006.01)
*H05K 5/03* (2006.01)

(52) U.S. Cl.
CPC ........... *H05K 1/028* (2013.01); *G04G 17/045* (2013.01); *H05K 5/03* (2013.01); *H05K 2201/09027* (2013.01); *H05K 2201/09063* (2013.01); *H05K 2201/10128* (2013.01)

(58) Field of Classification Search
CPC ........ H05K 1/028; H05K 1/147; H05K 1/118; H05K 1/189; H05K 2201/10128; H05K 2201/09063; H05K 2201/09027; G02F 1/133308; G02F 1/133; G02F 1/13452; G06F 1/1601; G06F 1/1613
See application file for complete search history.

(56) References Cited

U.S. PATENT DOCUMENTS

| 9,591,746 | B2 | 3/2017 | Kim et al. |
| 10,001,664 | B2 | 6/2018 | Mitani et al. |
| 10,162,311 | B2 | 12/2018 | Hong et al. |
| 10,820,417 | B2 | 10/2020 | Park et al. |
| 2007/0013824 | A1* | 1/2007 | Yu ..................... G02F 1/133308 349/150 |
| 2007/0263998 | A1* | 11/2007 | Lien ....................... H05K 1/189 396/144 |
| 2008/0078573 | A1* | 4/2008 | Hu ....................... H05K 1/0219 174/262 |
| 2008/0088768 | A1* | 4/2008 | Kohno ................ G02F 1/13452 349/60 |

(Continued)

FOREIGN PATENT DOCUMENTS

| EP | 3 591 464 | 1/2020 |
| KR | 10-2114319 | 5/2020 |

*Primary Examiner* — Roshn K Varghese
(74) *Attorney, Agent, or Firm* — F. CHAU & ASSOCIATES, LLC

(57) ABSTRACT

An electronic apparatus includes a window that includes a substantially planar base and an edge portion that protrudes from an edge of the base, a display panel disposed on the base of the window, and a flexible printed circuit board disposed on and electrically connected to the display panel. The flexible printed circuit board includes a neck portion in contact with the display panel, a body portion connected to the neck portion and that has an area greater than that of the neck portion, and a first slit formed in the body portion.

17 Claims, 13 Drawing Sheets

(56) References Cited

U.S. PATENT DOCUMENTS

2016/0092001 A1\* 3/2016 Choi ................. G06F 3/0416
                                                    345/174
2016/0219706 A1\* 7/2016 Jo ..................... H05K 1/118

\* cited by examiner

ELECTRONIC APPARATUS

CROSS-REFERENCE TO RELATED APPLICATION

This application claims priority under 35 U.S.C. § 119 from Korean Patent Application No. 10-2021-0013473, filed on Jan. 29, 2021 in the Korean Intellectual Property Office, the contents of which are herein incorporated by reference in their entirety.

BACKGROUND

1. Technical Field

One or more embodiments are directed to an electronic apparatus, and more particularly, to an electronic apparatus with fewer defects in a manufacturing process.

2. Discussion of the Related Art

In general, an electronic apparatus such as a smart watch or a smart phone includes a display panel. In addition, a flexible printed circuit board that generates or transmits an electrical signal to the display panel is electrically connected to the display panel. In a manufacturing process of such an electronic apparatus, a display panel is manufactured, a printed circuit board is electrically connected to the display panel, and the display panel and the printed circuit board are placed in a case that forms the overall appearance of the electronic apparatus.

SUMMARY

One or more embodiments include an electronic apparatus with fewer defects in a manufacturing process. However, this is merely an example, and the scope of the disclosure is not limited thereto.

According to one or more embodiments, an electronic apparatus includes a window having a substantially planar base and an edge portion that protrudes from an edge of the bas, a display panel disposed on the base of the window, and a flexible printed circuit board disposed on and electrically connected to the display panel. The flexible printed circuit board includes a neck portion in contact with the display panel, a body portion connected to the neck portion and that has an area greater than that of the neck portion, and a first slit formed in the body portion.

The display panel may be located inside a space defined by the base and the edge portion of the window.

The first slit may extend in a same direction as the neck portion.

Letting A be a minimum distance between an inner surface of the edge portion that faces the display panel and an end of the display panel, B be a thickness of the edge portion at an end of the edge portion, and C be a minimum distance between a lower surface of the display panel and the end of the edge portion, a length L on the printed circuit board from an end of the first slit away from the display panel to the display panel may be greater than or equal to a value satisfying the following equation 1:

$$L = (A+B+C)\sin^{-1}\left(\frac{\sqrt{(A+B)^2+C^2}}{A+B+C}\right).$$

The printed circuit board may further include a second slit in the body portion, wherein the first slit may be located on one side of the neck portion, and the second slit may be located on the other side of the neck portion.

A length of the first slit may be a same as a length of the second slit.

The first slit and the second slit may extend in a same direction as the neck portion.

The first slit may extend in a direction that crosses an extension direction of the neck portion.

The first slit may extend in a direction perpendicular to the extension direction of the neck portion.

Letting A be a minimum distance between an inner surface of the edge portion that faces the display panel and an end of the display panel, B be a thickness of the edge portion at an end of the edge portion, and C be a minimum distance between a lower surface of the display panel and the end of the edge portion, a minimum distance D on the printed circuit board between a virtual straight line in an extension direction of the first slit and the end of the display panel may be less than or equal to a value that satisfies the following equation 4:

$$D = (A+B+C)\sin^{-1}\left(\frac{\sqrt{(A+B)^2+C^2}}{A+B+C}\right).$$

The printed circuit board may further include a second slit in the body portion, wherein the first slit may be located on one side of the neck portion, and the second slit may be located on the other side of the neck portion and may extend in a same direction as the first slit.

A virtual straight line that passes through the first slit may pass through the second slit.

The first slit may extend in a direction that crosses the neck portion and forms an acute angle with the extension direction of the neck portion.

The printed circuit board may further include a second slit in the body portion, and the second slit may have a shape that is symmetric to the first slit with respect to an extension axis of the neck portion.

An end of the first slit toward the inside of the base may have a semi-polygonal shape.

An end of the first slit in the base may have a curved shape.

The end of the first slit in the base may have a semi-circular shape.

The end of the first slit in the base may have a shape corresponding to at least a portion of a circle whose radius may be greater than a width of the first slit.

One or more embodiments include an electronic apparatus that includes a window that includes a substantially planar base and an edge portion that protrudes from an edge of the base; a display panel disposed on the base of the window; and a flexible printed circuit board disposed on and electrically connected to the display panel. The flexible printed circuit board includes a neck portion in contact with the display panel, a body portion connected to the neck portion and that has an area greater than that of the neck portion, and a first slit formed in the body portion and that extends in a same direction as the neck portion. Letting A be a minimum distance between an inner surface of the edge portion that faces the display panel and an end of the display panel, B be a thickness of the edge portion at an end of the edge portion, and C be a minimum distance between a lower surface of the display panel and the end of the edge portion, a length L on the printed circuit board from an end of the first slit away from the display panel to the display panel is greater than or equal to a value satisfying the following Equation 1:

$$(A+B+C)\sin^{-1}\left(\frac{\sqrt{(A+B)^2+C^2}}{A+B+C}\right).$$

One or more embodiments include an electronic apparatus that includes a window that includes a substantially planar base and an edge portion that protrudes from an edge of the base; a display panel disposed on the base of the window; and a flexible printed circuit board disposed on and electrically connected to the display panel. The flexible printed circuit board includes a neck portion in contact with the display panel, a body portion connected to the neck portion and that has an area greater than that of the neck portion, and a first slit formed in the body portion and that extends in a direction perpendicular to an extension direction of the neck portion. Letting A be a minimum distance between an inner surface of the edge portion that faces the display panel and an end of the display panel, B be a thickness of the edge portion at an end of the edge portion, and C be a minimum distance between a lower surface of the display panel and the end of the edge portion, a minimum distance D on the printed circuit board between a virtual straight line in an extension direction of the first slit and the end of the display panel is less than or equal to a value satisfying the following equation 4:

$$(A+B+C)\sin^{-1}\left(\frac{\sqrt{(A+B)^2+C^2}}{A+B+C}\right).$$

These and/or other aspects will become apparent and more readily appreciated from the following description of the embodiments, taken in conjunction with the accompanying drawings.

DETAILED DESCRIPTION

Figure 1:
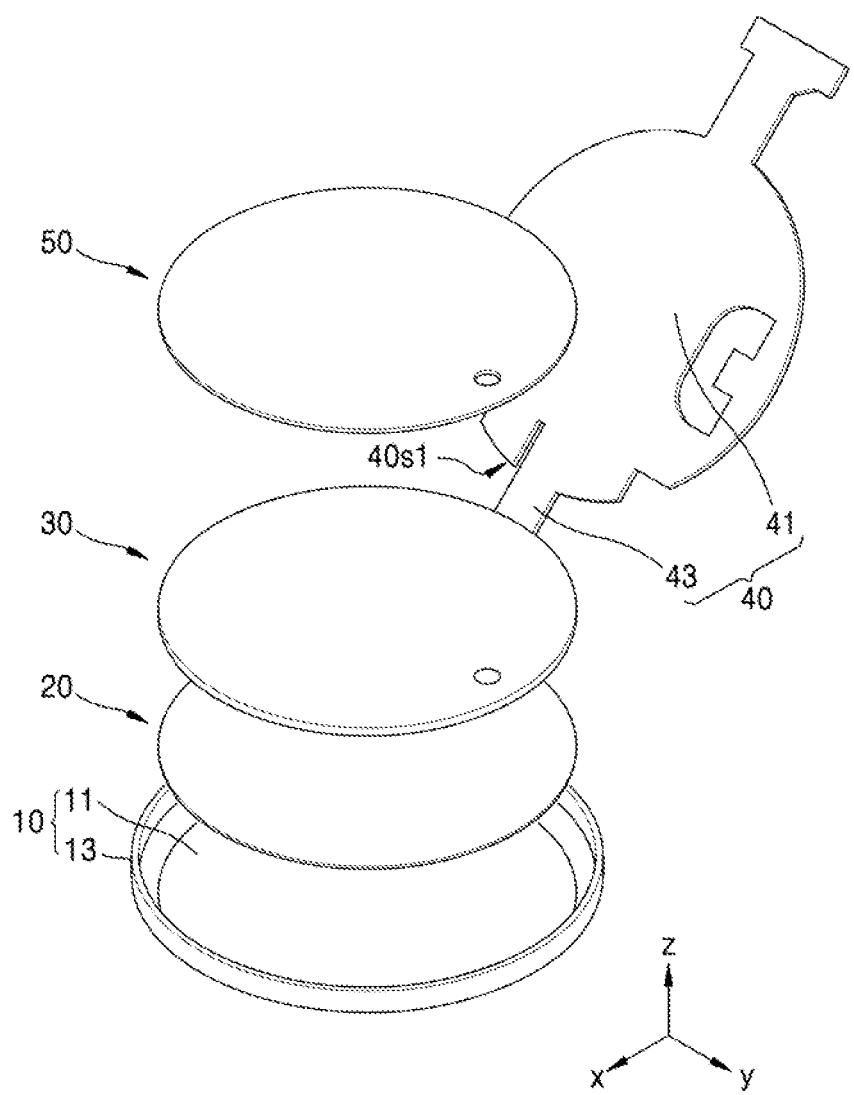
FIG. 1 is an exploded perspective view of an electronic apparatus according to an embodiment.

Reference will now be made in detail to embodiments, examples of which are illustrated in the accompanying drawings, wherein like reference numerals may refer to like elements throughout. In this regard, the present embodiments may have different forms and should not be construed as being limited to the descriptions set forth herein.

Reference will now be made in detail to embodiments, examples of which are illustrated in the accompanying drawings, wherein like reference numerals may refer to like elements throughout, and repeated description thereof may be omitted.

It will be understood that when a layer, region, or component is referred to as being "formed on" another layer, region, or component, it can be directly or indirectly formed on the other layer, region, or component.

Figure 2:
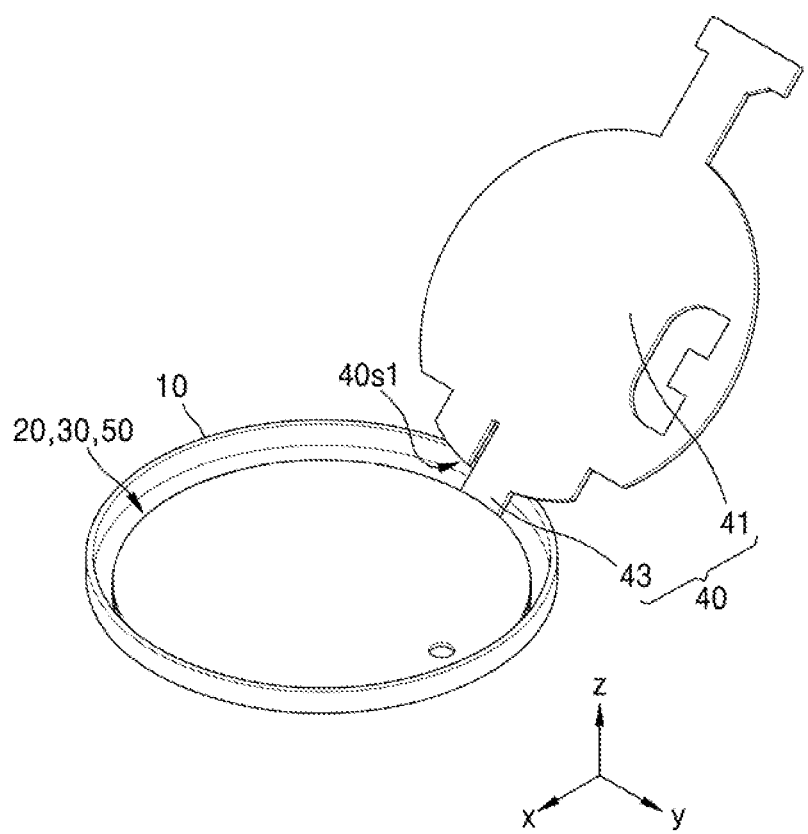
FIG. 2 is a perspective view of some of components shown in FIG. 1.
Figure 3:
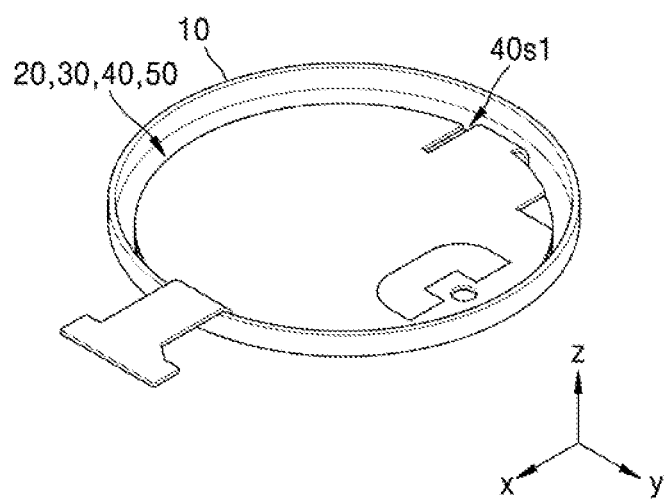
FIG. 3 is a perspective view of some of components shown in FIG. 2.

FIG. 1 is an exploded perspective view of an electronic apparatus according to an embodiment, FIG. 2 is a perspective view of components shown in FIG. 1, and FIG. 3 is a perspective view of components shown in FIG. 2.

An electronic apparatus according to a present embodiment includes a window 10, a display panel 30, and a flexible printed circuit board 40. However, as illustrated in FIG. 1, the electronic apparatus may further include various components as necessary. For example, the electronic apparatus further includes a light-transmitting adhesive layer 20 interposed between the window 10 and the display panel 30 to couple the window 10 and the display panel 30, or a cover panel 50 on the display panel 30.

In an embodiment, the window 10 is formed of a light-transmitting material and may include glass or a polymer resin. For example, the window 10 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

In an embodiment, the window 10 includes a base 11 and an edge portion 13. The base 11 determines the overall appearance of the window 10 and transmits light. The edge portion 13 protrudes from an edge of the base 11 upward from a first virtual plane on which the base 11 is located. FIG. 1 shows that the base 11 is located on the first virtual plane that is approximately parallel to an x-y plane and the edge portion 13 protrudes from an edge of the base 11 in a +z direction perpendicular to the x-y plane. The base 11 and the edge portion 13 include a same material and are integrally formed, but embodiments of the disclosure are not limited thereto. For example, in other embodiments, the edge portion 13 is a separate component coupled to the edge of the base 11. In this case, the edge portion 13 is non-transmissive, unlike the light-transmitting base 11.

In an embodiment, the base 11 is located in the first virtual plane, but portions of the base may be curved. For example, when the electronic apparatus is a smart watch, the base 11 of the window 10 has a flat shape as a whole, but an outer surface of the base 11 opposite to the display panel 30 includes a portion that is microscopically curved in the −z direction.

In an embodiment, the display panel 30 is disposed on the base 11 of the window 10. The display panel 30 includes a circuit that includes an electronic apparatus such as a thin film transistor on a substrate, and a display device such as an organic light-emitting device electrically connected to the circuit. However, embodiments of the disclosure are not limited thereto. In other embodiments, the display panel 30 includes various other display devices, such as a liquid crystal device.

In an embodiment, the printed circuit board 40 is flexible. This printed circuit board 40 is electrically connected to the display panel 30. For example, as illustrated in FIG. 1, a portion of the printed circuit board 40 is electrically attached onto a surface of the display panel 30 in a direction toward the window 10. In this case, wires of the printed circuit board 40 are electrically connected to pads located on the surface of the display panel 30 through an anisotropic conductive film, etc.

In an embodiment, the printed circuit board 40 includes a body portion 41 and a neck portion 43. The neck portion 43 contacts the display panel 30 as described above. The body portion 41 has an area greater than that of the neck portion 43, and an electronic apparatus such as an integrated circuit is attached to the body portion 41 of the printed circuit board 40 through an anisotropic conductive film, etc. The printed circuit board 40 has a first slit 40s1 formed in the body portion 41.

In an embodiment, the cover panel 50 is formed of, for example, metal. The cover panel 50 is disposed on the display panel 30 in a +z direction opposite to the window 10, and shields the display panel 30 from external electrical signals or electromagnetic waves.

In an embodiment, the display panel 30 and the cover panel 50 are disposed on the window 10 as shown in FIG. 2. That is, the display panel 30 and the cover panel 50 are located inside a space defined by the base 11 and the edge portion 13 of the window 10. The printed circuit board 40 electrically connected to the display panel 30 is bent at the neck portion 43 as shown in FIG. 3 so that the body portion 41 is located on the cover panel 50. Because the printed circuit board 40 is flexible, as described above, the neck portion 43 is flexible and is bent as shown in FIGS. 2 and 3 so that the body portion 41 is placed on the cover panel 50. If necessary, the body portion 41 is also flexible. In this case, the neck portion 43 is more flexible than the body portion 41.

Figure 4:
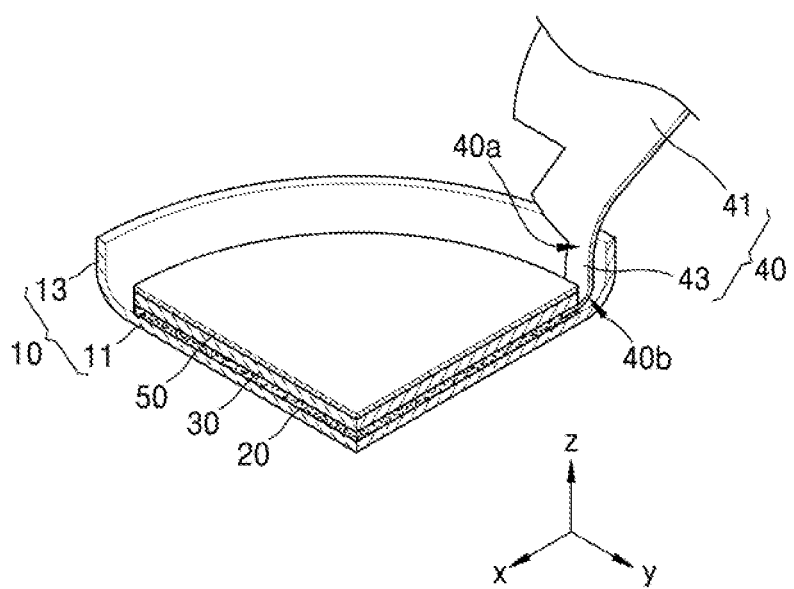
FIG. 4 is a perspective view of a portion of an electronic apparatus according to a comparative example in a manufacturing process of the electronic apparatus according to the comparative example.

FIG. 4 is a perspective view of a portion of an electronic apparatus according to a comparative example in a manufacturing process of the electronic apparatus according to the comparative example. As described above, in a manufacturing process of an electronic apparatus, the display panel 30 and the cover panel 50 are located in a space defined by the base 11 and the edge portion 13 of the window 10. Thereafter, the printed circuit board 40 is bent at the neck portion 43 so that the body portion 41 of the printed circuit board 40 is located on the display panel 30 and the cover panel 50. FIG. 4 illustrates a process of placing the display panel 30 and the cover panel 50, etc., in the space defined by the base 11 and the edge portion 13 of the window 10 in the manufacturing process of the electronic apparatus.

In a manufacturing process of an electronic apparatus, the printed circuit board 40 is initially located outside the space defined by the base 11 and the edge portion 13 of the window 10. In this process, the neck portion 43 is bent in a direction opposite to a direction in which the body portion 41 is bent so that the body portion 41 is located above the display panel 30, as illustrated in FIG. 4. At this time, because an area of the body portion 41 of the printed circuit board 40 is greater than an area of the neck portion 43, a relatively large amount of stress is applied to the neck portion 43. In particular, when an electronic apparatus such as an integrated circuit is mounted on the body portion 41, a weight of the body portion 41 increases, and thus, a large amount of stress is applied to the neck portion 43. Such stress is particularly concentrated on a first portion 40a that is a virtual boundary between the neck portion 43 and the body portion 41, and a second portion 40b that is outside of the display panel 30. Accordingly, some of wirings on the neck portion 43 of the printed circuit board 40 can be disconnected. In some cases, a crack occurs in the neck portion 43, or the printed circuit board 40 is cut at the neck portion 43.

Figure 5:
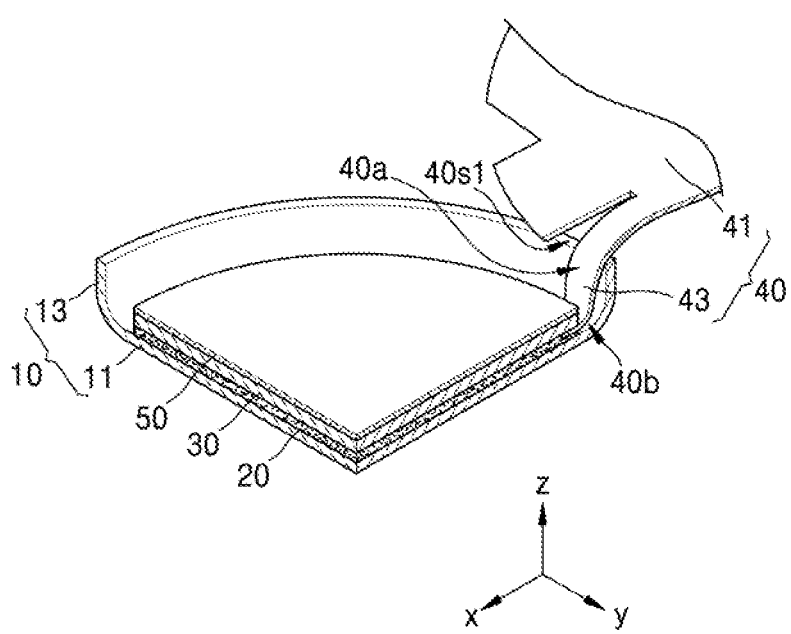
FIG. 5 is a perspective view of a portion of an electronic apparatus of FIG. 1 in a manufacturing process according to an embodiment.

In the case of an electronic apparatus according to a present embodiment, as described above, the printed circuit board 40 has the first slit 40s1 in the body portion 41. FIG. 5 illustrates how the neck portion 43 is bent in a direction opposite to a direction in which the body portion 41 is bent such that the body portion 41 is located above the display panel 30 in a manufacturing process of an electronic apparatus according to a present embodiment. In the case of an electronic apparatus according to a present embodiment, as described above, the printed circuit board 40 has the first slit 40s1 in the body portion 41. Therefore, even if the neck portion 43 is bent in the direction opposite to the direction in which the body portion 41 is bent such that the body portion 41 is located above the display panel 30, stress applied to the neck portion 43 is reduced.

In particular, as various functions are added to a smart watch, the protrusion of the edge portion 13 of the window 10 from the first virtual plane of the base 11 increases. This is to place more electronic apparatuses, such as a small camera or a large capacity battery, in the space defined by the base 11 and the edge portion 13 of the window 10. On the other hand, in the case of an electronic apparatus according to a comparative example shown in FIG. 4, as the protrusion of the edge portion 13 increases, the stress applied to the neck portion 43 of the printed circuit board 40 increases in a manufacturing process.

However, in an electronic apparatus according to a present embodiment, because the printed circuit board 40 has the first slit 40s1 in the body portion 41 as shown in FIG. 5, the flexibility near the first slit 40s1 of the body portion 41 as well as the neck portion 43 is further increased, and accordingly, stress applied to the neck portion 43 is reduced. The first slit 40s1 extends in a same direction as the neck portion 43. Through this, the flexibility near the first slit 40s1 of the body portion 41 increases.

As a result of a simulation, in the case of the comparative example shown in FIG. 4, the amount of stress applied to the first portion 40a is 168.770 MPa, and the amount of stress applied to the second portion 40b is 785.882 MPa. However, in an embodiment shown in FIG. 5, the amount of stress applied to the first portion 40a is only 109.265 MPa, and the amount of stress applied to the second portion 40b is only 487.378 MPa. Accordingly, in an embodiment of FIG. 5, the amount of stress applied to the neck portion of the printed circuit board 40 is reduced by approximately 38% as compared to the case of FIG. 4.

Figure 6:
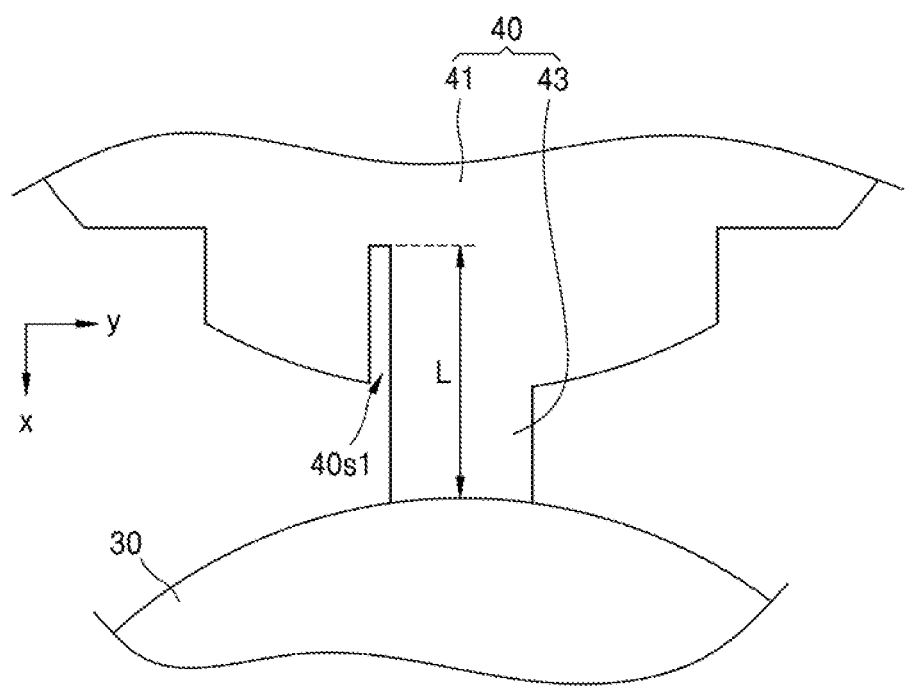
FIG. 6 is a plan view of a portion of an electronic apparatus of FIG. 1 in a manufacturing process according to an embodiment.

FIG. 6 is a plan view of a portion of an electronic apparatus of FIG. 1 in a manufacturing process of an electronic apparatus of FIG. 1. FIG. 6 shows that the neck portion 43 of the printed circuit board 40 is not bent so that the printed circuit board 40 and the display panel 30 are located in substantially the same x-y plane when the printed circuit board 40 is electrically connected to the display panel 30. As shown in FIG. 6, the first slit 40s1 extends in a same x-axis direction as the neck portion 43. At this time, a length L of the printed circuit board 40 from an end of the neck portion 43 on the display panel 30 to an end of the first slit 40s1 in a direction away from the display panel 30, is greater than or equal to a value that satisfies Equation 1 below.

Equation 1:

$$L = (A + B + C)\sin^{-1}\left(\frac{\sqrt{(A+B)^2 + C^2}}{A + B + C}\right)$$

Figure 7:
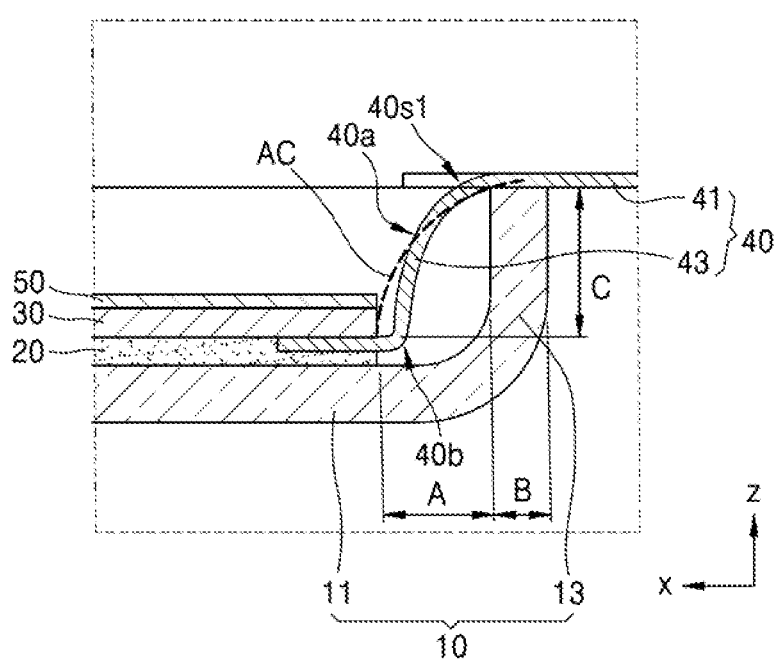
FIG. 7 is a side cross-sectional view of a portion of an electronic apparatus of FIG. 1 in a manufacturing process according to an embodiment.

Here, referring to FIG. 7, which is a side cross-sectional view of a portion of an electronic apparatus of FIG. 1, A is a minimum distance between an inner surface of the edge portion 13 at an end of the edge portion 13 of the window 10 and an end of the display panel 30. The inner surface of the edge portion 13 of the window 10 is a surface of the edge portion 13 that faces the display panel 30. B is a thickness of the edge portion 13 at the end of the edge portion 13 of the window 10. In addition, C is a minimum distance between a second virtual plane of a lower surface of the display panel 30 and the end of the edge portion 13 of the window 10. Hereinafter, a derivation process of Equation 1 will be described.

According to the Pythagorean theorem, a length of the hypotenuse of a right triangle with one side having length A+B and another side having length C is expressed as Equation 2 below.

$$\sqrt{(A+B)^2 + C^2} \qquad \text{Equation 2:}$$

Let a sector with such a hypotenuse be a chord; the sector has an arc AC indicated by dashed lines in FIG. 7. A central angle of the arc AC can be expressed as in Equation 3, below, by using a length of the chord in Equation 2. Here, as shown in FIG. 7, the length of A+B is approximately similar to the length of C, so a radius of the sector can be approximated to (A+B+C)/2. That is, a central angle of the sector whose radius is (A+B+C)/2 and whose chord has the length of Equation 2 can be expressed as Equation 3 below.

$$2\sin^{-1}\left(\frac{\sqrt{(A+B)^2 + C^2}}{A + B + C}\right) \qquad \text{Equation 3}$$

Because a length of the arc of a sector having such a central angle is the product of the approximate radius of (A+B+C)/2 and the central angle of Equation 3, the result of Equation 1 can be obtained. As shown in FIG. 7, a surface of the printed circuit board 40 substantially coincides with the arc AC indicated by dashed lines. Therefore, when the length L on the printed circuit board 40 from an end of the first slit 40s1 away from the display panel 30 to the display panel 30 satisfies Equation 1 as described above, the end of the first slit 40s1 away from the display panel 30 is approximately located at the end of the edge portion 13 of the window 10. Therefore, when the length L on the printed circuit board 40 from the end of the first slit 40s1 away from the display panel 30 to the display panel 30 satisfies Equation 1 as described above, even if the printed circuit board 40 is bent outside the window 10, stress applied to the neck portion 43 of the printed circuit board 40 due to such bending can be minimized.

Figure 8:
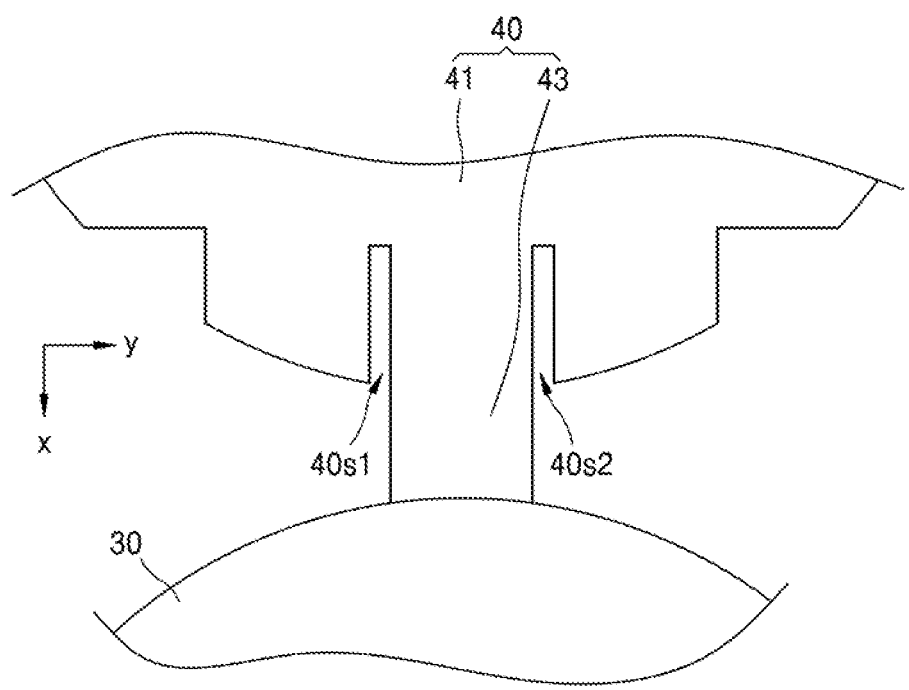
FIG. 8 is a plan view of a portion of an electronic apparatus in a manufacturing process according to an embodiment.

FIG. 8 is a plan view of a portion of an electronic apparatus in a manufacturing process according to an embodiment. As shown in FIG. 8, the printed circuit board 40 further includes a second slit 40s2 in the body portion 41. Here, the first slit 40s1 is on one side of the neck portion 43 and the second slit 40s2 is on the other side of the neck portion 43. The first slit 40s1 and the second slit 40s2 extend in a same direction as the neck portion 43. Through this, even if the printed circuit board 40 is bent outside the window 10 during a manufacturing process, stress applied to the neck portion 43 of the printed circuit board 40 due to such bending can be further reduced as compared to when the printed circuit board 40 has only one slit.

In this case, in an embodiment shown in FIG. 8, a length of the first slit 40s1 is the same as a length of the second slit 40s2. However, the lengths of the first slit 40s1 and the second slit 40s2 may be greater than or equal to the value satisfying Equation 1 above.

Figure 9:
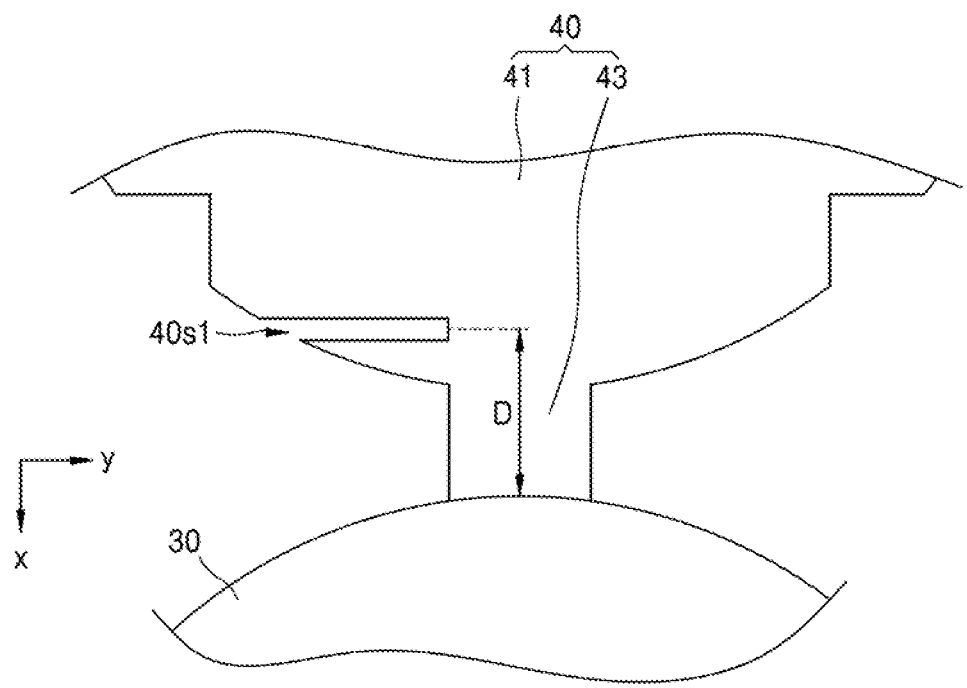
FIG. 9 is a plan view of a portion of an electronic apparatus in a manufacturing process according to an embodiment.

FIG. 9 is a plan view of a portion of an electronic apparatus in a manufacturing process according to an embodiment. An electronic apparatus according to a present embodiment differs from an electronic apparatus according to embodiments described above with reference to FIGS. 1 to 8 with regard to a direction of the first slit 40s1. In an electronic apparatus according to a present embodiment, the first slit 40s1 formed in the body portion 41 of the printed circuit board 40 extends in a direction that crosses an extending direction of the neck portion 43. In more detail, the first slit 40s1 formed in the body portion 41 of the printed circuit board 40 extends in a direction perpendicular to the direction in which the neck portion 43 extends. In other words, the neck portion 43 extends in the x direction, and the first slit 40s1 extends in the y direction perpendicular to the x direction. In an electronic apparatus according to a present embodiment, even if the flexibility near the first slit 40s1 of the body portion 41 increases, and the printed circuit board 40 is bent outside the window 10 during a manufacturing process, stress applied to the neck portion 43 due to such bending is effectively reduced.

On the other hand, in an embodiment, the minimum distance D on the printed circuit board 40 between a virtual straight line in the y direction and an end of the display panel 30 is less than or equal to a value satisfying Equation 4 below.

$$D = (A + B + C)\sin^{-1}\left(\frac{\sqrt{(A+B)^2 + C^2}}{A + B + C}\right) \qquad \text{Equation 4}$$

Here, A, B, and C are the same as those described above with reference to FIG. 7. In other words, A is a minimum distance between an inner surface of the edge portion 13 at the end of the edge portion 13 of the window 10 and the end of the display panel 30, as shown in FIG. 7. The inner surface of the edge portion 13 is a surface of the edge portion 43 that faces the display panel 30. B is a thickness of the edge portion 13 at the end of the edge portion 13 of the window 10. In addition, C is a minimum distance between a second virtual plane of a lower surface of the display panel 30 and the end of the edge portion 13 of the window 10.

In an embodiment, a derivation process of Equation 4 as described above is the same as the derivation process of Equation 1 described above. When the printed circuit board 40 has a value of D that satisfies t Equation 4, the first slit 40s1 is located on the end of the edge portion 13 of the window 10. When the printed circuit board 40 is bent outside the window 10 in a manufacturing process, the printed circuit board 40 can be easily bent at the end of the edge portion 13 of the window 10 where the first slit 40s1 is formed, and thus, stress applied to the neck portion 43 can be minimized.

On the other hand, if this first slit 40s1 is formed outside the end of the edge portion 13 of the window 10, stress applied to the neck portion 43 by the first slit 40s1 cannot be relieved. This is because, in such a case, the body portion 41, which is wider than the neck portion 43, contacts the end of the edge portion 13 when the first slit 40s1 is formed outside the end of the edge portion 13 of the window 10. Therefore, the minimum distance D on the printed circuit board 40 between the virtual straight line and the end of the display panel 30 is less than or equal to the value satisfying Equation 4 below.

Figure 10:
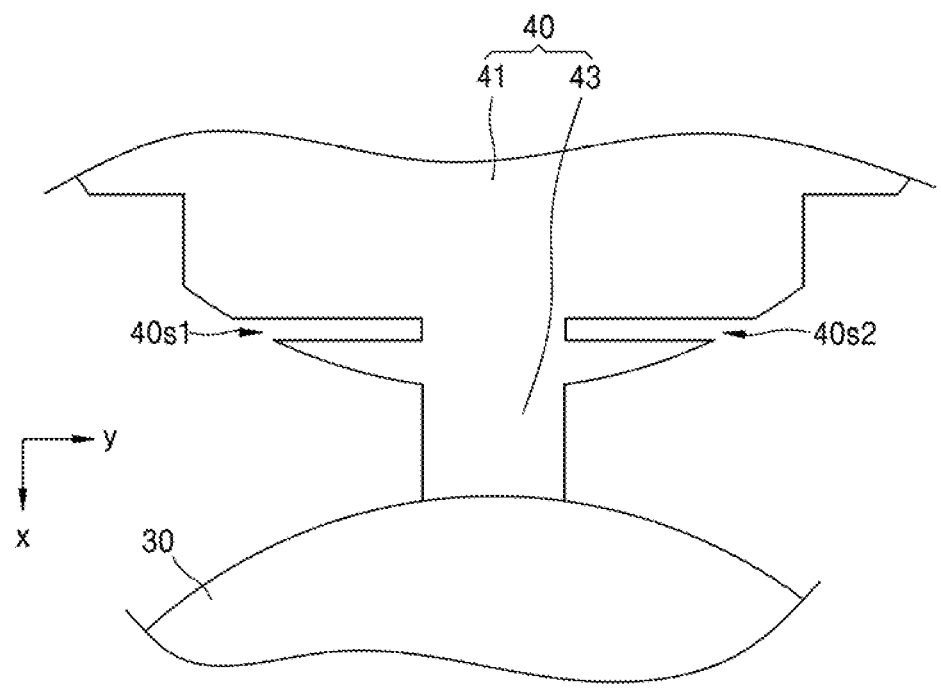
FIG. 10 is a plan view of a portion of an electronic apparatus in a manufacturing process according to an embodiment.

FIG. 10 is a plan view of a portion of an electronic apparatus in a manufacturing process according to an embodiment. In an electronic apparatus according to a present embodiment, unlike an electronic apparatus described above with reference to FIG. 9, the printed circuit board 40 includes a second slit 40s2 in the body portion 41. Here, the first slit 40s1 is on one side of the neck portion 43 and the second slit 40s2 is on the other side of the neck portion 43. In addition, as shown in FIG. 10, the second slit 40s2 extends in a same direction as the first slit 40s1, namely the y-direction. In an electronic apparatus according to a present embodiment, even if the printed circuit board 40 is bent outside the window 10 during a manufacturing process, stress applied to the neck portion 43 of the printed circuit board 40 due to such bending is further reduced as compared to when the printed circuit board 40 has only one slit. Here, as shown in FIG. 10, a virtual straight line that passes through the first slit 40s1 also passes through the second slit 40s2.

Figure 11:
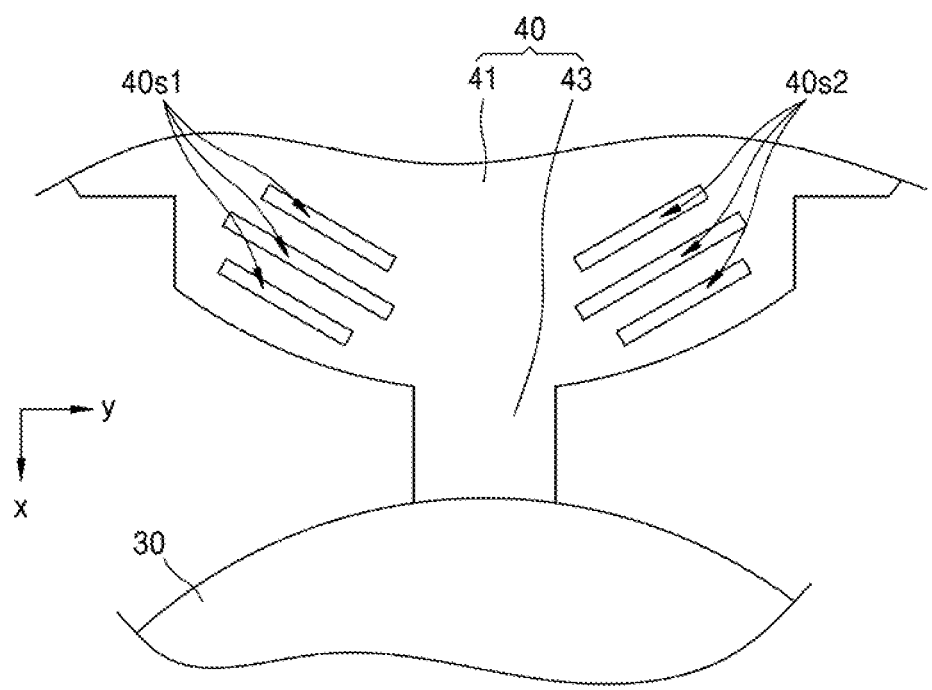
FIG. 11 is a plan view of a portion of an electronic apparatus in a manufacturing process according to an embodiment.

FIG. 11 is a plan view of a portion of an electronic apparatus in a manufacturing process according to an embodiment. In an electronic apparatus according to a present embodiment, the first slit 40s1 extends in a direction that crosses the neck portion 43 at an acute angle with respect to an extension direction of the neck portion 43. That is, the first slit 40s1 extends in a direction oblique to the extension direction of the neck portion 43. Through this, even if the printed circuit board 40 is bent outside the window 10 during a manufacturing process, stress applied to the neck portion 43 of the printed circuit board 40 due to such bending is reduced. In addition, to maximize the effect of this stress reduction, the printed circuit board 40 further includes a second slit 40s2 in the body portion 41 as shown in FIG. 11, and the second slit 40s2 has a shape that is symmetric to the first slit 40s1 with respect to an extension axis of the neck portion 43. In addition, the body portion 41 includes a plurality of each of the first slit 40s1 and the second slit 40s2.

In various embodiments described so far, an end of the first slit 40s1 toward the inside of the body portion 41 has a semi-polygonal shape. FIGS. 1 to 11 show that the end of the first slit 40s1 toward the inside of the body portion 41 has a semi-rectangular shape that includes two right angles. However, embodiments of the disclosure are not limited thereto.

Figure 12:
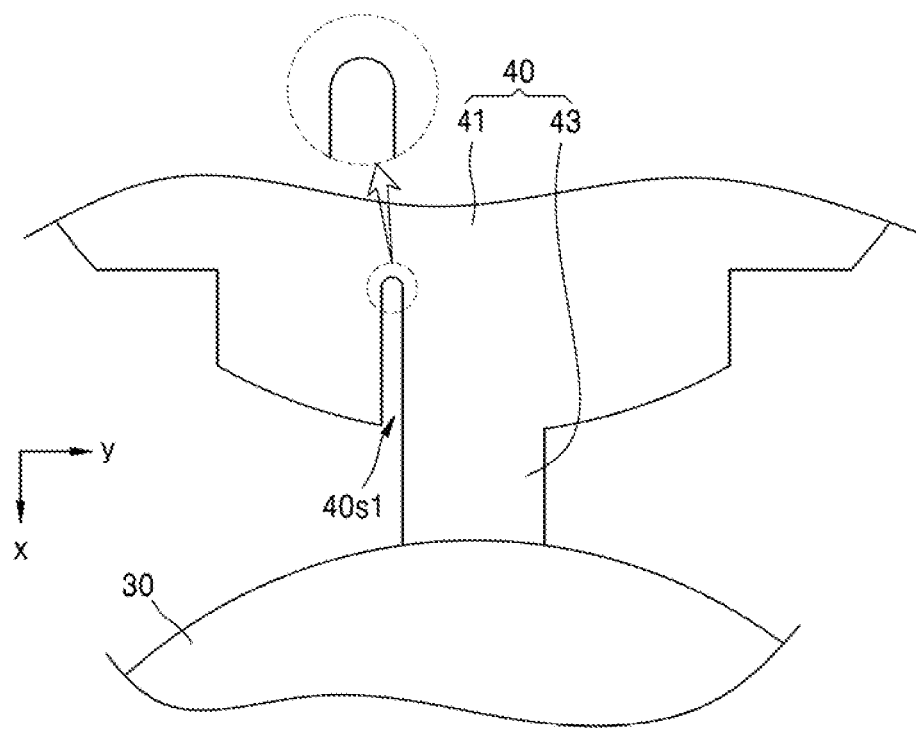
FIG. 12 is a plan view of a portion of an electronic apparatus in a manufacturing process according to an embodiment.
Figure 13:
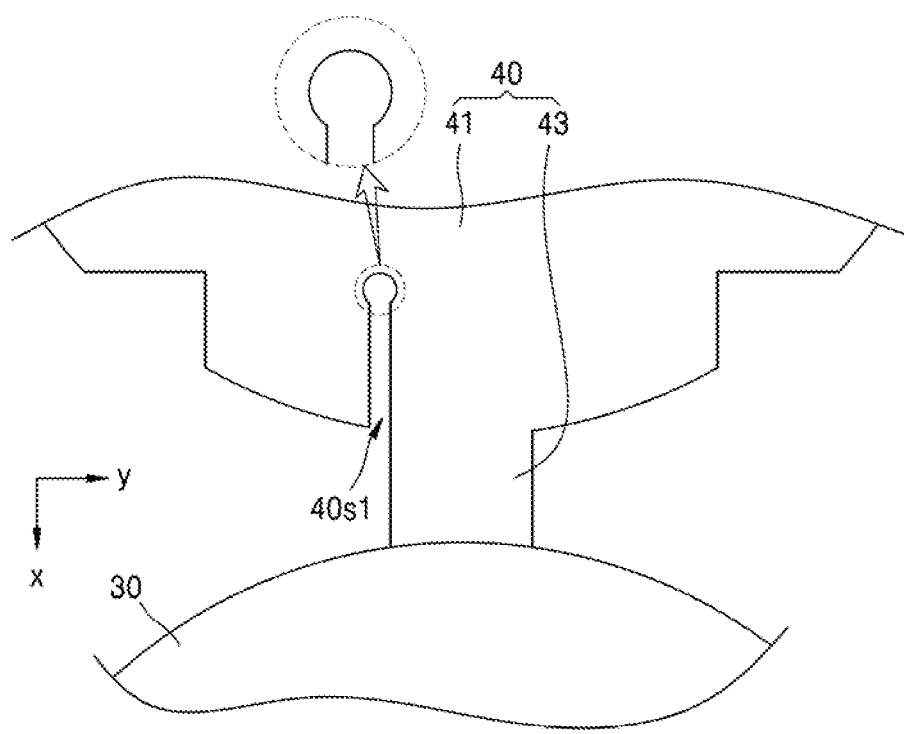
FIG. 13 is a plan view of a portion of a electronic apparatus in a manufacturing process according to an embodiment.

For example, according to an embodiment, as shown in FIG. 12, which is a plan view of a portion of an electronic apparatus in a manufacturing process according to an embodiment, an end of the first slit 40s1 in the body portion 41 has a curved shape. In more detail, the end of the first slit 40s1 in the body portion 41 has a semicircular shape. In addition, as shown in FIG. 13, which is a plan view of a portion of an electronic apparatus in a manufacturing process according to another embodiment, the end of the first slit 40s1 in the body portion 41 has a shape corresponding to at least a portion of a circle whose radius is greater than a width of the first slit 40s1. Even if stress is applied to the end of the body portion 41 of the first slit 40s1, the stress is dispersed i through these structures, so that the occurrence of cracks, etc., in a printed circuit board at the end of the first slit 40s1 is effectively prevented. In addition, the the second slit 40s2 may also have this shape.

Until now, a case in which the base 11 has a substantially circular shape when viewed in a plan view has been described. However, embodiments of the disclosure are not limited thereto. A case where the base 11 has an oval or rectangular shape in a plan view is also within the scope of the disclosure.

According to an embodiment as described above, an electronic apparatus with fewer defects in a manufacturing process can be implemented. However, the scope of embodiments of the disclosure is not limited to the effect.

It should be understood that embodiments described herein should be considered in a descriptive sense only and, not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic apparatus, comprising:
   a window that includes a substantially planar base and an edge portion that protrudes from an edge of the base;
   a display panel disposed on the base of the window, wherein the display panel displays an image;
   a light-transmitting adhesive layer interposed between the window and the display panel that couples the window and the display panel; and
   a flexible printed circuit board disposed on and electrically connected to the display panel,
   wherein the flexible printed circuit board includes a neck portion in contact with the display panel and that extends between the display panel and the light-transmitting adhesive layer, a body portion connected to the neck portion and that has an area greater than that of the neck portion, and a first slit formed in the body portion adjacent to the neck portion,
   wherein the first slit extends into the body portion from a position where the neck portion is connected to the body portion,
   wherein the first slit extends in a same direction as the neck portion, and
   letting A be a minimum distance between an inner surface of the edge portion that faces the display panel and an end of the display panel, B be a thickness of the edge portion at an end of the edge portion, and C be a minimum distance between a lower surface of the display panel and the end of the edge portion, a length L on the printed circuit board from an end of the first slit away from the display panel to the display panel is greater than or equal to a value that satisfies a following Equation 1:

$$L = (A+B+C)\sin^{-1}\left(\frac{\sqrt{(A+B)^2+C^2}}{A+B+C}\right).$$

2. The electronic apparatus of claim 1, wherein the edge portion protrudes from the edge of the base upward from a first virtual plane on which the base is located so that a space is defined by the base and the edge portion of the window, and the display panel is located inside the space defined by the base and the edge portion of the window.

3. The electronic apparatus of claim 1, wherein the printed circuit board further comprises a second slit in the body portion, wherein the first slit is located on one side of the neck portion, and the second slit is located on an other side of the neck portion.

4. The electronic apparatus of claim 3, wherein a length of the first slit is a same as a length of the second slit.

5. The electronic apparatus of claim 3, wherein the first slit and the second slit each extend in a same direction as the neck portion.

6. The electronic apparatus of claim 1, wherein the first slit extends in a direction that crosses an extension direction of the neck portion.

7. The electronic apparatus of claim 6, wherein the printed circuit board further comprises a second slit in the body portion, wherein the first slit is located on one side of the neck portion, and the second slit is located on an other side of the neck portion and extends in a same direction as the first slit.

8. The electronic apparatus of claim 7, wherein a virtual straight line that passes through the first slit also passes through the second slit.

9. The electronic apparatus of claim 6, wherein the first slit extends in a direction that crosses the neck portion and forms an acute angle with an extension direction of the neck portion.

10. The electronic apparatus of claim 9, wherein the printed circuit board further comprises a second slit in the body portion, and the second slit has a shape that is symmetric to the first slit with respect to an extension axis of the neck portion.

11. The electronic apparatus of claim 1, wherein an end of the first slit toward the inside of the base has a semi-polygonal shape.

12. The electronic apparatus of claim 1, wherein an end of the first slit in the base has a curved shape.

13. The electronic apparatus of claim 1, wherein an end of the first slit in the base has a semicircular shape.

14. The electronic apparatus of claim 1, wherein an end of the first slit in the base has a shape corresponding to at least a portion of a circle whose radius is greater than a width of the first slit.

15. An electronic apparatus, comprising:
a window that includes a substantially planar base and an edge portion that protrudes from an edge of the base;
a display panel disposed on the base of the window, wherein the display panel displays an image;
a light-transmitting adhesive layer interposed between the window and the display panel that couples the window and the display panel; and
a flexible printed circuit board disposed on and electrically connected to the display panel,
wherein the flexible printed circuit board includes a neck portion in contact with the display panel and that extends between the display panel and the light-transmitting adhesive layer, a body portion connected to the neck portion and that has an area greater than that of the neck portion, and a first slit formed in the body portion adjacent to the neck portion,
wherein the first slit extends into the body portion from a position where the neck portion is connected to the body portion,
wherein the first slit extends in a direction perpendicular to the extension direction of the neck portion, and
letting A be a minimum distance between an inner surface of the edge portion that faces the display panel and an end of the display panel, B be a thickness of the edge portion at an end of the edge portion, and C be a minimum distance between a lower surface of the display panel and the end of the edge portion, a minimum distance D on the printed circuit board between a virtual straight line in an extension direction of the first slit and the end of the display panel is less than or equal to a value that satisfies a following equation 4:

$$D = (A+B+C)\sin^{-1}\left(\frac{\sqrt{(A+B)^2+C^2}}{A+B+C}\right).$$

16. An electronic apparatus, comprising:
a window that includes a substantially planar base and an edge portion that protrudes from an edge of the base;
a display panel disposed on the base of the window; and
a flexible printed circuit board disposed on and electrically connected to the display panel, wherein the flexible printed circuit board includes a neck portion in contact with the display panel, a body portion connected to the neck portion and that has an area greater than that of the neck portion, and a first slit formed in the body portion, wherein the first slit extends in a same direction as the neck portion, and
wherein, letting A be a minimum distance between an inner surface of the edge portion that faces the display panel and an end of the display panel, B be a thickness of the edge portion at an end of the edge portion, and C be a minimum distance between a lower surface of the display panel and the end of the edge portion, a length L on the printed circuit board from an end of the first slit away from the display panel to the display panel is greater than or equal to a value satisfying a following Equation 1:

$$L = (A+B+C)\sin^{-1}\left(\frac{\sqrt{(A+B)^2+C^2}}{A+B+C}\right).$$

17. An electronic apparatus, comprising:
a window that includes a substantially planar base and an edge portion that protrudes from an edge of the base;
a display panel disposed on the base of the window; and a flexible printed circuit board disposed on and electrically connected to the display panel, wherein the flexible printed circuit board includes a neck portion in contact with the display panel, a body portion connected to the neck portion and that has an area greater than that of the neck portion, and a first slit formed in the body portion, wherein the first slit extends in a direction perpendicular to an extension direction of the neck portion, and wherein, letting A be a minimum distance between an inner surface of the edge portion that faces the display panel and an end of the display panel, B be a thickness of the edge portion at an end of the edge portion, and C be a minimum distance between a lower surface of the display panel and the end of the edge portion, a minimum distance D on the printed circuit board between a virtual straight line in an extension direction of the first slit and the end of the display panel is less than or equal to a value satisfying a following equation 4:

$$D = (A + B + C)\sin^{-1}\left(\frac{\sqrt{(A+B)^2 + C^2}}{A + B + C}\right).$$

* * * * *